United States Patent [19]

Hlavka

[11] 4,266,194

[45] May 5, 1981

[54] SENSOR FOR VT PROBES

[75] Inventor: Lloyd F. Hlavka, Palo Alto, Calif.

[73] Assignee: Varian Associates, Inc., Palo Alto, Calif.

[21] Appl. No.: 59,820

[22] Filed: Jul. 23, 1979

[51] Int. Cl.³ .............................................. G01R 33/08
[52] U.S. Cl. ...................................... 324/315; 324/321
[58] Field of Search ................. 324/300, 310, 315, 321

[56] References Cited

U.S. PATENT DOCUMENTS

| 3,502,964 | 3/1970 | Freeman | 324/315 |
|---|---|---|---|
| 3,512,078 | 5/1970 | Hall | 324/321 |
| 3,525,928 | 8/1970 | Kanihiko Nagao | 324/315 |
| 3,588,677 | 6/1971 | Kleiman | 324/321 |
| 3,621,378 | 11/1971 | Kleiman | 324/315 |
| 3,810,254 | 5/1974 | Utsumi | 324/315 |
| 3,987,361 | 10/1976 | Martin | 324/315 |

Primary Examiner—Michael J. Tokar
Attorney, Agent, or Firm—Stanley Z. Cole; Gerald M. Fisher

[57] ABSTRACT

Accurate non-invasive temperature control of NMR samples without reduction of spectral quality is provided by placement of multiple sensors in the probe structure, the output of said sensors being weighted to provide an averaged reading of sample temperature in the receiver coil region.

4 Claims, 3 Drawing Figures

SENSOR FOR VT PROBES

BACKGROUND OF THE INVENTION

This invention relates to nuclear magnetic resonance spectroscopy and more particularly to a system for controlling the temperature of samples being tested in an NMR spectrometer.

Accurate sample temperature detection and maintenance can be critical during an NMR experiment. For example, biological samples may deteriorate rapidly if not held at or near their normal reaction temperature. Inorganic reactions can explode violently if not maintained slightly below their critical temperature. Yet to determine structure it may be required that the sample be studied at degrees or fractions of degrees below this critical temperature. However, since spinner apparatus is employed to rotate the samples at various speeds, and since temperature sensors disturb field homogeneity, temperature sensors are not usually able to be immersed in the sample during tests. Hence determination of sample temperature during NMR observation has been accomplished through the use of a sensor mounted adjacent the sample. The sensor is normally mounted in a position just slightly below the sample holder in the gas stream used to heat or cool the sample. Heat leaks prevent the sample and sensor from being the same temperature.

PRIOR ART

Conventionally, gyromagnetic resonance spectrometers have employed a temperature sensing element such as a platinum resistor disposed within the probe structure slightly below the sample under analysis. This single sensing element configuration enabled reasonably accurate temperature determinations in gyromagnetic resonance spectrometer probes having a constant set of parameters determining heat losses from the heater to the sample.

In gyromagnetic resonance spectrometer probes with temperature-controlled gas flow around the sample, temperature gradients occur in the gas stream. These gradients are not detected by a single sensor located below the sample and hence the temperature at the sample center is not known precisely.

Prior art has developed several methods which attempted to both overcome the temperature gradient problem and determine accurate sample temperatures.

Shoolery in U.S. Pat. No. 2,864,995 flowed a temperature-controlled fluid (air) between the sample tube and the insert in order to control sample temperature. Apparatus external to the sample probe structure was used to control the sample temperature but no actual knowledge of sample temperature was obtained. Since the flow path was constant, it was assumed that everything reached a constant temperature with previously measured gradients.

It is also known to slide a sensor down the temperature-controlled air passageway to close proximity of the receiver coil to sense temperature near the sample.

U.S. Pat. No. 3,502,964, assigned to the same assignee, taught a method for sample temperature determination using a temperature dependent resonance sample disposed in heat exchanging relation with the sample under analysis. In addition to this temperature dependent sample, a thermocouple was mounted approximately one-inch below the sample tube in the stream of the temperature-controlled flow gas.

Duerst and Merbach in *Review of Scientific Instruments* page 1896 (1965) described a means for direct sample temperature detection by introduction of both a thermocouple and a temperature dependent sample directly into the sample via capillary tubes. Comparison of the thermocouple reading with the temperature dependent sample resonance shifts provided a chart of calibrated temperature dependent sample resonances. However, while this procedure enabled direct measurement of the sample temperature, the presence of the thermocouple in the region of the receiver coil disturbed the homogeneity of the magnetic field and reduced spectral quality.

SUMMARY OF PRESENT INVENTION

The present invention provides a non-invasive means for accurate sample temperature determination in gyromagnetic resonance spectrometers by arranging a plurality of sensors around the sample to detect temperature gradients. Circuitry connecting the thermocouples is provided such that a weighted average of the temperature gradients provides an accurate temperature reading of the sample in the receiver coil region.

In one embodiment of this invention, one or a plurality of the sensors is mounted in the stream of a temperature-controlled flow fluid, and senses temperature at positions in the gas stream which are more extreme (meaning a positive or negative variation from room temperature) than the sample. The actual sample temperature is dependent on flow rate of the temperature-controlled fluid. In addition to the initial sensor, one or a plurality of sensors is mounted in the probe structure, in the gas stream, at a position where the temperature is less extreme than the sample. Since there are always heat leaks to the ambient, even with Dewars, there are always positions in the gas stream which are more extreme and less extreme than the sample.

Another feature of this invention is the connection of the thermocouples to an adjustable potentiometer circuit. Calibration of the circuit is accomplished using the resonances or chemical shifts of a standard temperature-responsive sample. The thermocouple circuit is adjusted until the weighted-average voltage reading corresponds to the temperature-responsive sample chemical shift difference at the temperature of interest. Once the thermocouple circuit is calibrated, sample temperatures can be determined accurately without further adjustment.

BACKGROUND OF THE INVENTION

Figure 1:
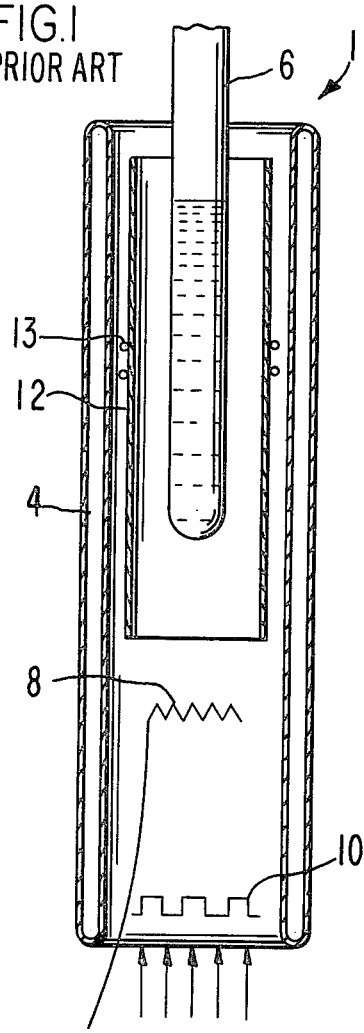
FIG. 1 shows a representation of the probe and sample tube of an NMR spectrometer employing conventional prior art temperature sensing configuration.

With reference to FIG. 1, a probe structure of prior art NMR spectrometer in the region of the sample is described. The prior art sensor 8 in a gyromagnetic resonance spectrometer probe structure is shown disposed in the probe structure 1 approximately one-inch below the bottom of the sample tube 6. In operation, temperature-controlled gas flows between sample tube 6 and insert 12, and past sensor 8. An insulated envelope or Dewar 4 is placed around receiver coil 13 to isolate the sample from external structures so that temperature control is primarily a function of the gas temperature and flow.

Further prior art attempts at sample temperature determination in a gyromagnetic resonance spectrometer included insertion of a thermocouple encased in a capillary tube directly into sample 6 in the region of receiver coil 13. In this case, the directly inserted thermocouple was operated independently of sensor 8. Changes in field homogeneity and corresponding decreases in spectral quality resulted from disturbances of the magnetic lines of force by this capillary thermocouple inserted directly into the receiver coil 13 region of sample 6.

A still further prior art attempt at accurate sample temperature determination involved insertion of a thermocouple through an opening in the dewar as described in U.S. Pat. No. 2,864,995 to a depth near that of receiver coil 13. The insertion of the thermocouple into the Dewar jacket provided a temperature reading at the depth of the receiver coil but did not necessarily accurately represent the sample temperature at the exact center of RF coil 13.

DESCRIPTION OF THE INVENTION

Figure 2:
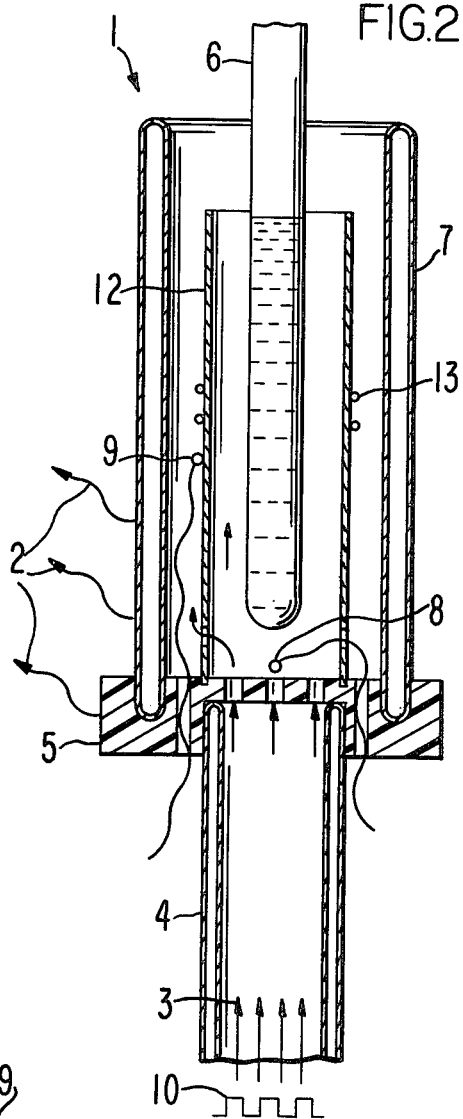
FIG. 2 shows a schematic embodiment of the present invention whereby a plurality of sensors are disposed around a gyromagnetic resonance spectrometer sample.

One embodiment of the present invention is schematically depicted in FIG. 2. A plurality of sensors 8, 9 are placed around the sample tube 6 in probe structure 1. One or more of the sensors 8 is disposed upstream of the sample in the gas flow stream 3 and provides a temperature indication more extreme than the sample. One or more sensors 9 is attached to insert 12 at various positions where the temperature is less extreme than the sample. Since there are heat losses 2 through the probe structure, temperature extremes vary along the path of the temperature-controlled gas 3. The placement of the sensors must be such that they will provide temperature indications with extremes which are greater and smaller than those of the sample.

Figure 3:
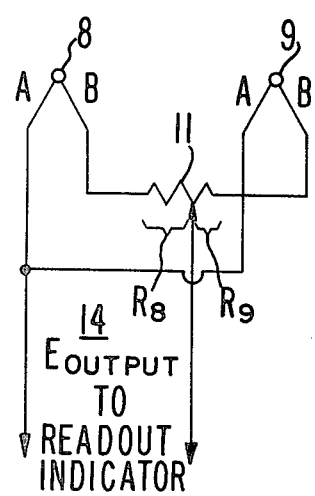
FIG. 3 illustrates a potentiometer circuit for adjusting the weighted average of the plurality of thermocouple readings. Two sensors were used for this illustration.

A potentiometer circuit such as depicted in FIG. 3 allows adjustment of the combined sensor output 14 for accurate reflection of the actual sample temperature. The circuit is calibrated using a temperature-sensitive NMR standard material, whose chemical shifts provide the actual sample temperature. The weighted average of the sensor voltages, determined by the potentiometer circuit, is adjusted so that the temperature controller readout represents the same temperature as the temperature reflected by the chemical shift difference of the temperature-sensitive standard. Thus, once the circuit is calibrated, the plurality of sensors around the sample will provide a non-invasive, accurate temperature of the sample without the prior art drawbacks of spectral quality reduction and extreme temperature sensitivity to the rate of gas flow.

In doing VT experiments the sample temperature can be either increased or decreased from room temperature. For the purpose of this discussion, an increase will be taken to be positive.

The sample temperature is controlled by a stream of temperature controlled gas 3 flowing past the heater 10, through the Dewar 4, support member 5, upper Dewar 7, and around items 6, 8, 9, 12, and 13. As the heated gas flows upward there is a continual loss of heat which causes the gas temperature to lower as it flows upward. There is also a radial temperature gradient so that the gas at a fixed horizontal position is lower in temperature along the outer radius. Again this is due to heat losses to the ambient atmosphere.

Since there are gradients, the temperature at position 8 is not the same as the sample temperature. The temperature at position 8 and 9 are above and below respectively the sample temperature. The individual sensor outputs are not accurate representations of the sample temperatures but a weighted average of these sensor outputs can be created which is an accurate representation. FIG. 3, shows the connection of the sensors to a potentiometer 11 and adjustment of the potentiometer 11 allows the proper weighting to be achieved.

CALIBRATION PROCEDURE

Assume sensor 8 is 2% above the sample temperature and sensor 9 is 1% below. This can be determined by measuring the chemical shift of the sample and the temperature at sensor 8 and 9, i.e., by measuring the output with potentiometer wiper first at one end and then the other. The potentiometer can now be adjusted so that each sensor has a weighting to give an output which accurately represents the sample temperature.

| | |
|---|---|
| $T_9 = T_S(.99)$ | $T_S$ = Temperature of Sample |
| $T_8 = T_S(1.02)$ | $T_9$ = Temperature of Sensor 9 |
| | $T_8$ = Temperature of Sensor 8 |

The sensors and potentiometers of FIG. 3 can be represented by an equation which gives the output as a function of of the two individual sensors and the potentiometer as follows:

$$E_{OUTPUT} = T_9 R_8/(R_8+R_9) + T_8 R_9/(R_8+R_9)$$

Now substitute our actual temperatures which have an assumed error:

$$E_{OUTPUT} = T_S(0.99)R_8/(R_8+R_9) + T_S(1.02)R_9/(R_8+R_9)$$

The ratio of $R_8$:$R_9$ to make the $E_{OUTPUT}$ represent $T_S$ is easily obtained $$E_{OUTPUT} = T_S = (0.99)R_8/(R_8+R_9) + T_S(1.02)R_9/(R_8+R_9)$$

$$T_S = T_S(0.99)R_8/(R_8+R_9) + T_S(1.02)R_9/(R_8+R_9)$$

$T_S$ cancels to give:

$$1 = (0.99R_8 + 1.02R_9)/(R_8+R_9) \therefore R_8 = 2R_9$$

This is the ratio which, for our assumed displacements, will make the E OUTPUT represent the actual sample temperature. Accordingly, in this example, with thermocouple 9 open, the potentiometer would be adjusted to read $\frac{2}{3}$ of the resistance of 11. This adjustment for the assumed temperatures will assure proper weighting of the sensor readings.

I claim:

1. An improved nuclear magnetic resonance spectrometer comprising:
   means for applying an alternating RF field and an orthogonal fixed DC magnetic field to a sample under test, said sample being disposed in a first tube which is surrounded by a second tube, means for introducing and permitting a flowing temperature controlled fluid into the space between said first and second tube, said first tube being configured for spinning in said second tube during operation of said spectrometer, and means for controlling the temperature of said flowing fluid and said sample, said means for controlling the temperature of said sample including a plurality of sensor means, each said sensor means disposed adjacent said sample and in said fluid flow, said sensor means being interconnected to obtain a weighted average output reading corresponding to the actual temperature of said sample.

2. The spectrometer of claim 1 wherein positioning of said plurality of sensors is such that one of said sensors is in the flow path of the temperature-controlled fluid where the temperature is more extreme than the sample, and the other said sensors are deployed at a position where the temperature is less extreme than the sample.

3. The spectrometer of claim 1 wherein the plurality of sensors is two.

4. The spectrometry of claim 1 wherein the sensors are thermocouples and wherein the thermocouples are connected in series circuit with a variable resistor, said variable resistor having a movable wiper connected to an output, said output being said weighted average output reading.

* * * * *